United States Patent
Jain et al.

(10) Patent No.: US 9,628,081 B2
(45) Date of Patent: Apr. 18, 2017

(54) INTERCONNECT CIRCUITS HAVING LOW THRESHOLD VOLTAGE P-CHANNEL TRANSISTORS FOR A PROGRAMMABLE INTEGRATED CIRCUIT

(71) Applicant: Xilinx, Inc., San Jose, CA (US)

(72) Inventors: Praful Jain, Los Gatos, CA (US);
Michael J. Hart, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 43 days.

(21) Appl. No.: 14/458,017

(22) Filed: Aug. 12, 2014

(65) Prior Publication Data
US 2016/0049940 A1    Feb. 18, 2016

(51) Int. Cl.
| H03K 19/0185 | (2006.01) |
| H01L 27/118 | (2006.01) |
| H03K 19/177 | (2006.01) |
| H03K 19/173 | (2006.01) |

(52) U.S. Cl.
CPC .............. *H03K 19/018571* (2013.01); *H01L 27/11803* (2013.01); *H03K 19/1737* (2013.01); *H03K 19/1776* (2013.01); *H03K 19/17736* (2013.01)

(58) Field of Classification Search
USPC .................... 326/38–39, 41, 44, 47, 49, 101
See application file for complete search history.

(56) References Cited

U.S. PATENT DOCUMENTS

| 6,489,804 | B1 | 12/2002 | Burr | |
| 6,535,034 | B1 * | 3/2003 | Wong | H01L 21/82385 257/E21.639 |
| 6,617,912 | B1 | 9/2003 | Bauer | |
| 6,621,325 | B2 | 9/2003 | Hart et al. | |
| 6,667,635 | B1 | 12/2003 | Pi et al. | |
| 6,777,978 | B2 | 8/2004 | Hart et al. | |
| 6,946,903 | B2 * | 9/2005 | Marshall | H03K 19/0016 327/530 |
| 7,089,527 | B2 | 8/2006 | Hart et al. | |
| 7,417,454 | B1 * | 8/2008 | Rahman | H03K 19/17784 326/113 |
| 7,893,712 | B1 * | 2/2011 | Tan | H03K 19/17784 326/113 |
| 8,378,718 | B2 * | 2/2013 | Hebert | H03G 1/0088 326/68 |
| 2003/0053335 | A1 | 3/2003 | Hart et al. | |
| 2004/0174187 | A1 | 9/2004 | New | |

(Continued)

FOREIGN PATENT DOCUMENTS

WO    2005116878    12/2005

*Primary Examiner* — Douglas W Owens
*Assistant Examiner* — James H Cho
(74) *Attorney, Agent, or Firm* — Robert M. Brush

(57) ABSTRACT

An exemplary interconnect circuit for a programmable integrated circuit (IC) includes an input terminal coupled to receive from a node in the programmable IC, an output terminal coupled to transmit towards another node in the programmable IC, first and second control terminals coupled to receive from a memory cell of the programmable IC, and a complementary metal oxide semiconductor (CMOS) pass-gate coupled between the input terminal and the output terminal and to the first and second control terminals. The CMOS pass-gate includes a P-channel transistor configured with a low threshold voltage for a CMOS process used to fabricate the programmable IC.

19 Claims, 5 Drawing Sheets

(56) References Cited

U.S. PATENT DOCUMENTS

| | | | |
|---|---|---|---|
| 2007/0008000 A1* | 1/2007 | Lee | H03K 17/063 326/41 |
| 2008/0130375 A1* | 6/2008 | Raghavan | G11C 8/10 365/189.02 |
| 2012/0161813 A1 | 6/2012 | Cho et al. | |

* cited by examiner

INTERCONNECT CIRCUITS HAVING LOW THRESHOLD VOLTAGE P-CHANNEL TRANSISTORS FOR A PROGRAMMABLE INTEGRATED CIRCUIT

TECHNICAL FIELD

Examples of the present disclosure generally relate to electronic circuits and, in particular, to interconnect circuits having low threshold voltage P-channel transistors for a programmable integrated circuit.

BACKGROUND

Integrated circuits (ICs) may be implemented to perform specified functions. One type of IC is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. The various logic elements can be interconnected by a programmable interconnect structure that include a large number of interconnect segments between interconnect circuits programmable through static memory cells in a configuration memory. The interconnect segments and logic elements can be selectively interconnected using programmed interconnect circuits. Interconnect circuits can include transistor pass-gates that selectively connect an input node to an output node. Interconnect delay, such as that introduced by transistor pass-gates, can provide a significant bottleneck to FPGA performance.

SUMMARY

Interconnect circuits having low threshold voltage P-channel transistors for a programmable integrated circuit (IC) are described. In an example implementation, an interconnect circuit for a programmable IC includes an input terminal coupled to receive from a node in the programmable IC, an output terminal coupled to transmit towards another node in the programmable IC, first and second control terminals coupled to receive from a memory cell of the programmable IC, and a complementary metal oxide semiconductor (CMOS) pass-gate coupled between the input terminal and the output terminal and to the first and second control terminals. The CMOS pass-gate includes a P-channel transistor configured with a low threshold voltage for a CMOS process used to fabricate the programmable IC.

In another example implementation, a programmable IC includes interconnect segments, configuration memory cells, and logic elements coupled to the interconnect segments through interconnect circuits programmable by a portion of the configuration memory cells. A first interconnect circuit includes a first CMOS pass-gate circuit having an N-channel transistor coupled in parallel with a P-channel transistor. The P-channel transistor is configured with a low threshold voltage for a CMOS process used to fabricate the programmable IC.

In another example implementation, a method of selectively coupling nodes in a programmable IC includes receiving an input signal from an input node at an input terminal of a CMOS pass-gate circuit having an N-channel transistor coupled in parallel with a P-channel transistor. The P-channel transistor is configured with a low threshold voltage for a CMOS process used to fabricate the programmable IC. The method further includes driving a gate terminal of the N-channel transistor with a first control signal from a memory cell in the programmable IC, driving a gate terminal of the P-channel transistor with a second control signal from the memory cell, and coupling an output signal from the CMOS pass-gate circuit to an output node in response to the first control signal and the second control signal.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Interconnect circuits having low threshold voltage P-channel transistors for a programmable integrated circuit (IC) are described. In an example implementation, an interconnect circuit includes one or more high-performance complementary metal-oxide semiconductor (CMOS) pass-gate circuits controlled by memory cell(s) to selectively couple input node(s) to output node(s) in the programmable IC. Each of the input and output nodes can be a conductor or wire in the programmable IC, such as a terminal of a logic element or an interconnect segment of the programmable interconnect. For example, the interconnect circuit can couple a logic element to interconnect segment(s), a logic element to other logic element(s), or interconnect segment(s) to other interconnect segment(s) in the programmable interconnect.

Each high-performance CMOS pass-gate circuit includes an N-channel transistor coupled in parallel with a P-channel transistor. The P-channel transistor is configured with a low threshold voltage for the CMOS process used to fabricate the programmable IC. The low threshold voltage P-channel transistor increases performance of the interconnect circuit by reducing signal delay through each CMOS pass-gate circuit. While the low threshold voltage P-channel transistor will increase leakage current through the CMOS pass-gate circuit, the pass-gate leakage current is a small component of total leakage in the programmable interconnect. Moreover, in some examples, the P-channel transistor can be back-biased to reduce sub-threshold leakage current when the P-channel transistor is in the off state. Hence, the net impact of the increase in leakage current is minimal, while the performance increase is significant. The performance per watt trade-off of using the low voltage threshold P-channel transistor in the high-performance CMOS pass-gate circuit is better than other techniques of increasing interconnect performance, such as increasing the supply voltage for the programmable interconnect or using low threshold voltage transistors in drivers of the programmable interconnect. These and other aspects are described further below.

Figure 1:
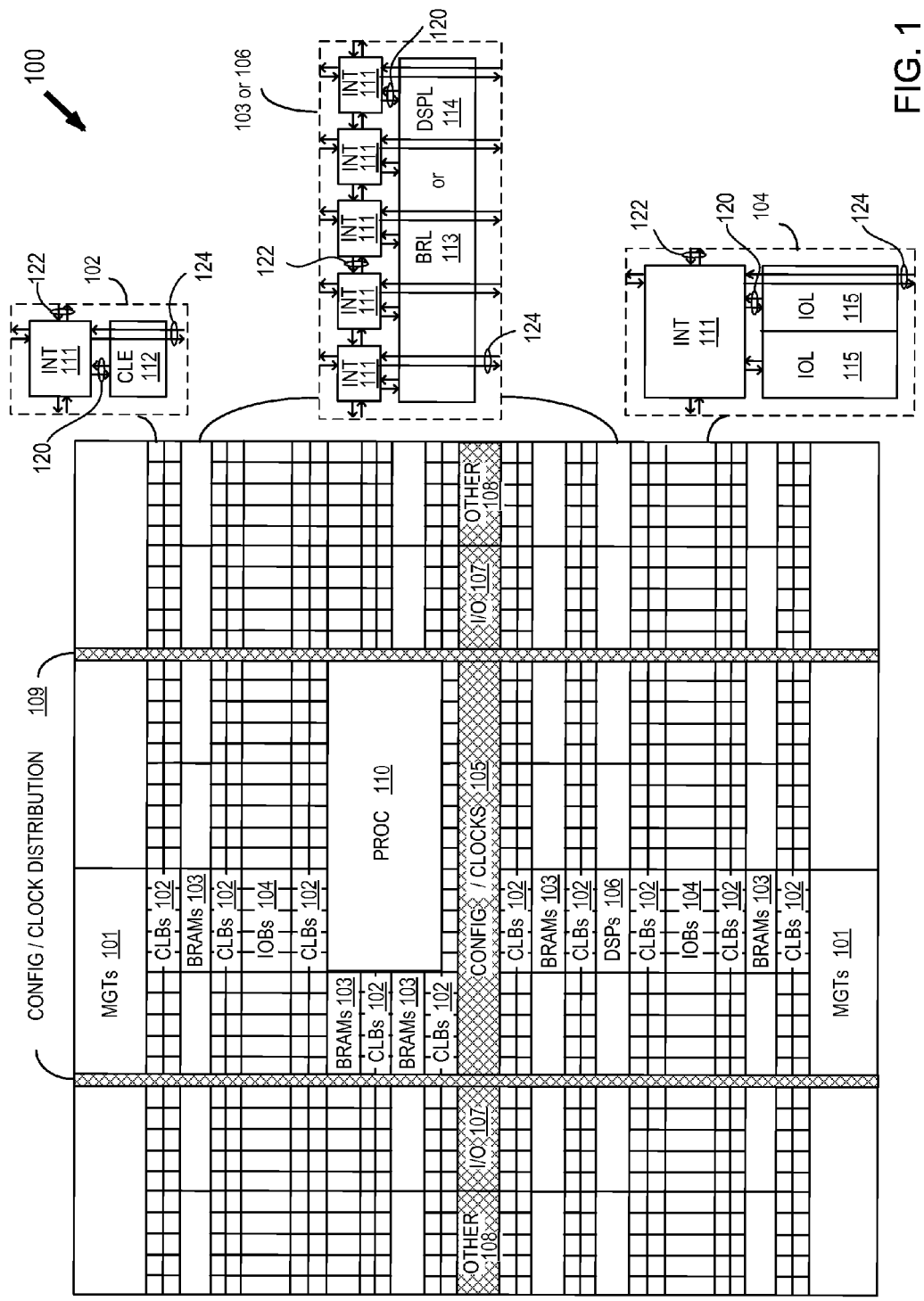
FIG. 1 illustrates an architecture of a programmable IC according to an example implementation.

Turning now to the figures, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. The configuration and clocking logic 105 includes configuration memory cells (not specifically shown) distributed throughout the FPGA architecture 100.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA. Each programmable interconnect element 111 can include an interconnect circuit that can implement various types of switching among input interconnect segments and output interconnect segments, such as cross-point switching, break-point switching, multiplexed switching, and the like. An example interconnect circuit for use in a programmable interconnect element 111 is described below with respect to FIG. 2.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured example, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs. The processor block 110 can various components ranging from a single microprocessor to a complete programmable processing system of microprocessor(s), memory controllers, peripherals, and the like.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. Moreover, the FPGA of FIG. 1 illustrates one example of a programmable IC that can employ examples of the interconnect circuits described herein. The interconnect circuits described herein can be used in other types of programmable ICs, such as complex programmable logic devices (CPLDs) or any type of programmable IC having a programmable interconnect structure for selectively coupling logic elements.

Figure 2:
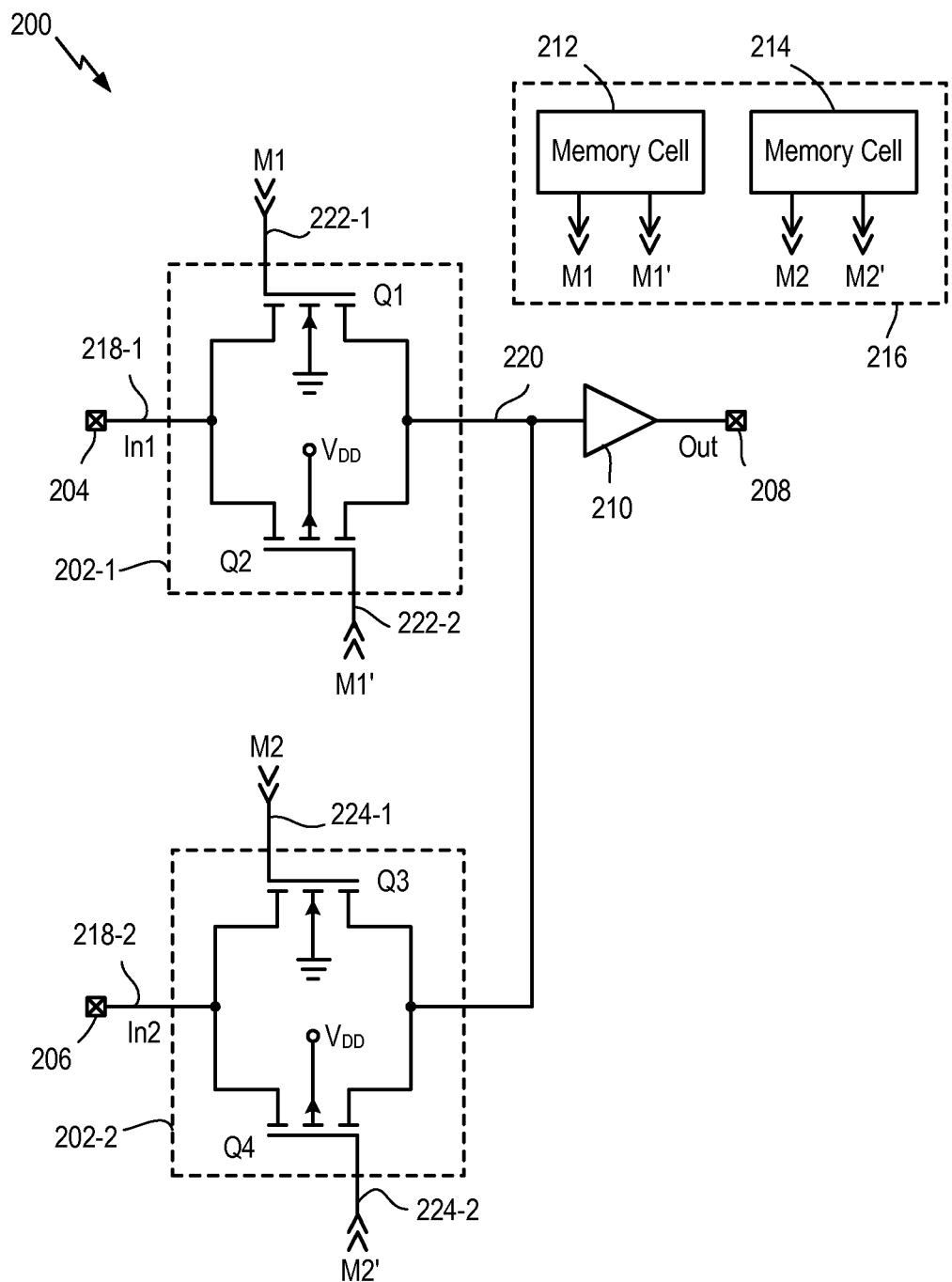
FIG. 2 is a block diagram depicting an interconnect circuit according to an example implementation.

FIG. 2 is a block diagram depicting an interconnect circuit 200 according to an example implementation. The interconnect circuit 200 generally includes a first input terminal 218-1 coupled to an input node 204, a second input terminal 218-2 coupled to an input node 206, and an output terminal 220 coupled to an output node 208 through an optional driver 210. The interconnect circuit 200 is also coupled to control terminals 222-1 and 222-2, and control terminals 224-1 and 224-2. Each of input nodes 204 and 206 can be an output of a logic element (e.g., an output of a CLB, IOB, BRAM, DSP, etc.) or an interconnect segment (e.g., an interconnect segment coupled to another interconnect circuit). The output node 208 can be an input of a logic element or an interconnect segment. The input node 204 provides a signal IN1, and the input node 206 provides a signal IN2. The output node 208 provides a signal OUT. The interconnect circuit 200 functions as a multiplexer that selectively couples either the input node 204 or the input node 206 to the output node 208. The interconnect circuit 200 can be part of a programmable interconnect element 111 that couples a logic element to the general routing resources, or part of a switch block that couples interconnect segments in the general routing resources.

The interconnect circuit 200 includes CMOS pass-gate circuits 202-1 and 202-2 (collectively referred to as "CMOS pass-gate circuits 202"). The CMOS pass-gate circuit 202-1 includes an N-channel transistor Q1 in parallel with a P-channel transistor Q2. The CMOS pass-gate circuit 202-2 includes an N-channel transistor Q3 in parallel with a P-channel transistor Q4. In some examples, the driver 210 can be provided to buffer the output of the CMOS pass-gate circuit 202-1 or 202-2.

The N-channel transistors Q1 and Q3 can also be referred to as N-type metal-oxide semiconductor (NMOS) field effect transistors (FETs), and the P-channel transistors Q2 and Q4 can also be referred to as P-type metal-oxide semiconductor (PMOS) FETs. A metal-oxide semiconductor FET (MOSFET) is a four-terminal device including source, drain, gate, and body (substrate) terminals. By convention, charge carriers enter the gate channel of a transistor from the source and leave the gate channel from the drain. The transistors Q1-Q4 are configured as pass-gates, and thus the source and drain terminals as defined by convention depend on relative values of voltage of the input terminals 218-1 and 218-2 and the output terminal 220. Accordingly, the transistors Q1-Q4 are described herein as having, in addition to the gate and body terminals, a first terminal on the input terminal side and a second terminal on the output terminal side.

First terminals of the transistors Q1 and Q2 are coupled to the input terminal 218-1. Second terminals of the transistors Q1 and Q2 are coupled to the output terminal 220. A body terminal of the transistor Q1 is coupled to a reference voltage $V_{REF}$ (e.g., electrical ground or some known voltage supply). A body terminal of the transistor Q2 is coupled to a supply voltage $V_{DD}$, which is higher than the reference voltage. As used herein, the reference voltage denotes a logic low or logic "0" and the voltage $V_{DD}$ denotes a logic high or logic "1". A gate terminal of the transistor Q1 is coupled to the control terminal 222-1 to receive a signal M1, and a gate terminal of the transistor Q2 is coupled to the control terminals 222-2 to receive a signal M1', where the "prime" modifying a signal name denotes a logical inversion. In an example, the signals M1 and M1' can be generated by a memory cell 212. For purposes of clarity by example, the reference voltage $V_{REF}$ is assumed to be electrical ground (i.e., zero voltage).

First terminals of the transistors Q3 and Q4 are coupled to the input terminal 218-2. Second terminals of the transistors Q3 and Q4 are coupled to the output terminal 220. A body terminal of the transistor Q3 is coupled to the reference voltage. A body terminal of the transistor Q4 is coupled to the supply voltage $V_{DD}$. A gate terminal of the transistor Q2 is coupled to the control terminal 224-1 to receive a signal M2, and a gate terminal of the transistor Q4 is coupled to the control terminal 224-2 to receive a signal M2'. In an example, the signals M2 and M2' can be generated by a memory cell 214.

The memory cells 212 and 214 can comprise any type of memory cells capable of retaining a voltage over time. In an example, the memory cells 212 and 214 comprise static random access memory (RAM) cells or the like. The memory cells 212 and 214 can be part of a configuration memory 216 of the programmable IC. Although the four signals M1, M1', M2, and M2' are shown as being generated by two memory cells, in other examples such signals can be generated by one or more memory cells.

In operation, the memory cells 212, 214 drive control terminals of the CMOS pass-gate circuits 202-1 and 202-2 such that one of the CMOS pass-gate circuits 202-1 or 202-2 is enabled to pass its respective input signal as the output signal while the other is disabled. By way of example, the follow discussion assumes that the CMOS pass-gate circuit 202-1 is enabled and the CMOS pass-gate circuit 202-2 is disabled. To enable the CMOS pass-gate circuit 202-1, the control signal M1 is a supply voltage, such as $V_{DD}$ or a voltage higher than $V_{DD}$ referred to herein as $V_{GG}$. Accordingly, the control signal M1' is the reference voltage. To disable the CMOS pass-gate circuit 202-2, the control signal M2 is the reference voltage, and the control signal M2' is a supply voltage $V_{DD}$ or $V_{GG}$.

In the examples below, the N-channel and P-channel transistors are described as being turned "on" and "off" in response to various bias conditions. As used herein, a transistor is "on" when biased to conduct current (referred to as "drain current") through a gate channel (e.g., when a MOSFET is operating in the ohmic or saturation regions). A transistor is "off" when biased to cutoff current conduction through the gate channel (e.g., when a MOSFET is operating in the cutoff region). An "off" transistor may conduct a sub-threshold or "leakage" current.

With respect to the enabled CMOS pass-gate circuit 202-1, consider a case where the output terminal 220 is at the reference voltage and the signal IN1 transitions from the reference voltage to the supply voltage $V_{DD}$ (e.g., transitions from logic low to logic high or "rising edge condition"). In the rising-edge condition, the first and second terminals of the N-channel transistor Q1 acts as the drain and source, respectively. The first and second terminals of the P-channel transistor Q2 act as the source and drain, respectively. For the N-channel transistor Q1, the gate voltage ($V_G$) is equal to the supply voltage $V_{DD}$ or $V_{GG}$, the drain voltage ($V_D$) is equal to the reference voltage, and the source voltage ($V_S$) varies over time from reference to the supply voltage $V_{DD}$. Hence, the gate-to-source voltage ($V_{GS}$) of the N-channel transistor Q1 varies and is equal to $\phi - V_O$, where $\phi$ is the supply voltage $V_{DD}$ or $V_{GG}$, and $V_O$ is the output voltage on the output terminal 220. The N-channel transistor Q1 is on until $V_O$ equals $\phi - V_{TN}$, where $V_{TN}$ is the threshold voltage of the N-channel transistor Q1. When $V_O$ reaches $\phi - V_{TN}$, $V_{GS}$ of the N-channel transistor Q1 equals the threshold voltage $V_{TN}$ and the N-channel transistor Q1 turns off. Since the source-to-body voltage ($V_{SB}$) is not zero, the threshold voltage $V_{TN}$ will be increased from its minimum value $V_{TN0}$ due to the body effect. For the P-channel transistor Q2, $V_G$ is equal to the reference voltage, $V_S$ is equal to the supply voltage $V_{DD}$, and $V_D$ varies over time from reference to the supply voltage $V_{DD}$. Hence, the source-to-gate voltage ($V_{SG}$) is constant and equal to $V_{DD}$. The P-channel transistor Q2 is on until $V_O$ equals $V_{DD}$.

Thus, in the rising-edge condition, the N-channel transistor Q1 will turn off before the output terminal 220 reaches $V_{DD}$, leaving only the P-channel transistor Q2 to supply charging current. When only one of the transistors supplies charging current, drive strength is decreased and the rise time of the output signal is increased. An increase in rise time of the output signal results in increased signal delay through the CMOS pass-gate circuit 202-1. The rise-time of the output signal can be improved by driving the gate of the N-channel transistor Q1 with a supply voltage $V_{GG}$, which is higher than $V_{DD}$. Increasing the gate-drive voltage of the N-channel transistor Q1 allows the N-channel transistor Q1 to supply charging current in parallel with the P-channel transistor Q2 for a longer time period, which improves the rise-time of the output signal.

Next, consider a case where the output terminal 220 is at $V_{DD}$ and the signal IN1 transitions from $V_{DD}$ to the reference voltage (e.g., transitions from logic high to logic low or "falling-edge condition"). In the falling-edge condition, the first and second terminals of the N-channel transistor Q1 acts as the source and drain, respectively. The first and second terminals of the P-channel transistor Q2 act as the drain and source, respectively. For the N-channel transistor Q1, $V_G$ is equal to the supply voltage $V_{DD}$ or $V_{GG}$, $V_S$ is equal to the reference voltage, and $V_D$ varies over time between $V_{DD}$ and reference. Hence, $V_{GS}$ of the N-channel transistor Q1 is constant and equal to $V_{DD}$ or $V_{GG}$. The N-channel transistor Q1 will remain on until $V_O$ equals the reference voltage. For the P-channel transistor Q2, $V_G$ is equal to the reference voltage, $V_D$ is equal to the reference voltage, and $V_S$ varies over time between $V_{DD}$ and reference. Hence, $V_{SG}$ of the P-channel transistor Q2 varies and is equal to $V_O$. The P-channel transistor Q2 is on until $V_O$ equals $V_{TP}$, where $V_{TP}$ is the threshold voltage of the P-channel transistor Q2. When $V_O$ reaches $V_{TP}$, $V_{SG}$ of the P-channel transistor Q2 equals the threshold voltage $V_{TP}$ and the P-channel transistor Q2 turns off. Since the source-to-body voltage ($V_{SB}$) is not zero, the threshold voltage $V_{TP}$ will be increased from its minimum value of $V_{TP0}$ due to the body effect.

Thus, in the falling-edge condition, the P-channel transistor Q2 will turn off before the output terminal 220 reaches the reference voltage, leaving only the N-channel transistor Q1 to supply charging current. When only one of the transistors supplies charging current, the fall-time of the output signal is increases, resulting in increased signal delay through the CMOS pass-gate circuit 202-1. The gate of the P-channel transistor Q2 is driven with the reference voltage, and so the fall-time cannot be improved by increasing the gate-drive voltage as in the rising-edge condition described above. To improve the fall-time and hence signal delay through the CMOS pass-gate circuit 202-1, the P-channel transistor Q2 can be configured with a low threshold voltage for the CMOS process used to fabricate the programmable IC.

For a given CMOS process, the technology library of the process can include P-channel transistors having a plurality of threshold voltages, including a P-channel transistor with a higher threshold voltage (e.g., highest threshold voltage) and a P-channel transistor with a lower threshold voltage (e.g., lowest threshold voltage). The threshold voltage of a transistor can be selectively configured by varying process parameters, such as gate oxide thickness, doping concentration, and the like, as is known in the art. For example, in a 20 nanometer (nm) CMOS process, a higher threshold voltage of a P-channel transistor can be between 250-300 millivolts (mv), and a lower threshold voltage of a P-channel transistor can be between 160-170 mv. Of course, the higher and lower threshold voltage ranges for P-channel transistors can vary depending on the particular CMOS process. Configuring the P-channel transistor Q2 in the CMOS pass-gate 202-1 with a low threshold voltage for the given CMOS process allows the P-channel transistor Q2 to supply charging current in parallel with the N-channel transistor Q1 for a longer time period during the falling-edge condition. This improves the fall-time of the output signal and hence decreases signal delay through the CMOS pass-gate circuit 202-1. The term "low threshold voltage" is meant to encompass a lower threshold voltage, or a lowest threshold voltage, selected from a plurality of threshold voltages for P-channel transistors in the technology library for a given CMOS process. In some examples, the low threshold voltage P-channel transistor has a lower threshold voltage than other selectable threshold voltages for the technology library of a given CMOS process. In other examples, the low threshold voltage P-channel transistor has a lowest threshold voltage in the technology library of a given CMOS process.

The low threshold voltage of the P-channel transistor increases leakage current in those CMOS pass-gate circuits that are disabled. For example, the CMOS pass-gate circuit 202-2 is disabled in the present example and the transistors Q3 and Q4 are off in both the rising-edge and falling-edge conditions described above. In the off state, both transistors Q3 and Q4 operate in the sub-threshold region and conduct leakage current. If the threshold voltages of the N-channel and P-channel transistors were approximately equal, the leakage current in the P-channel transistor would be 3-10 times smaller than the leakage current in the N-channel transistor. However, since the P-channel transistor Q4 is configured with a low threshold voltage for the given CMOS process, the leakage current through the P-channel transistor Q4 is approximately equal to the leakage current through the N-channel transistor Q3. Thus, leakage through the CMOS pass-gate circuit 202-2 is increased due to use of the low threshold voltage P-channel transistor. However, leakage through CMOS pass-gate circuits is a small component of the total leakage in the programmable interconnect. Other circuits in the programmable interconnect, such as drivers, contribute a much higher leakage current than the CMOS pass-gate circuits. Hence, the net impact of the leakage current caused by use of the low threshold voltage P-channel transistor in the CMOS pass-gate circuits is minimal, while the increase in performance is significant.

In an example, leakage current through the low threshold voltage P-channel transistor can be reduced by back-biasing the device, e.g., driving the gate with a supply voltage higher than substrate voltage (e.g., $V_{GG}$ or other supply voltage higher than $V_{DD}$) within a certain range. Outside of the range, a further increase in gate voltage with respect to substrate voltage will force the P-channel transistor to operate in the band-to-band tunneling region and work to increase leakage current due to gate-induced drain leakage (GIDL). The range can be determined empirically and/or theoretically for the particular P-channel transistor formed in the CMOS pass-gate circuit.

Figure 5:
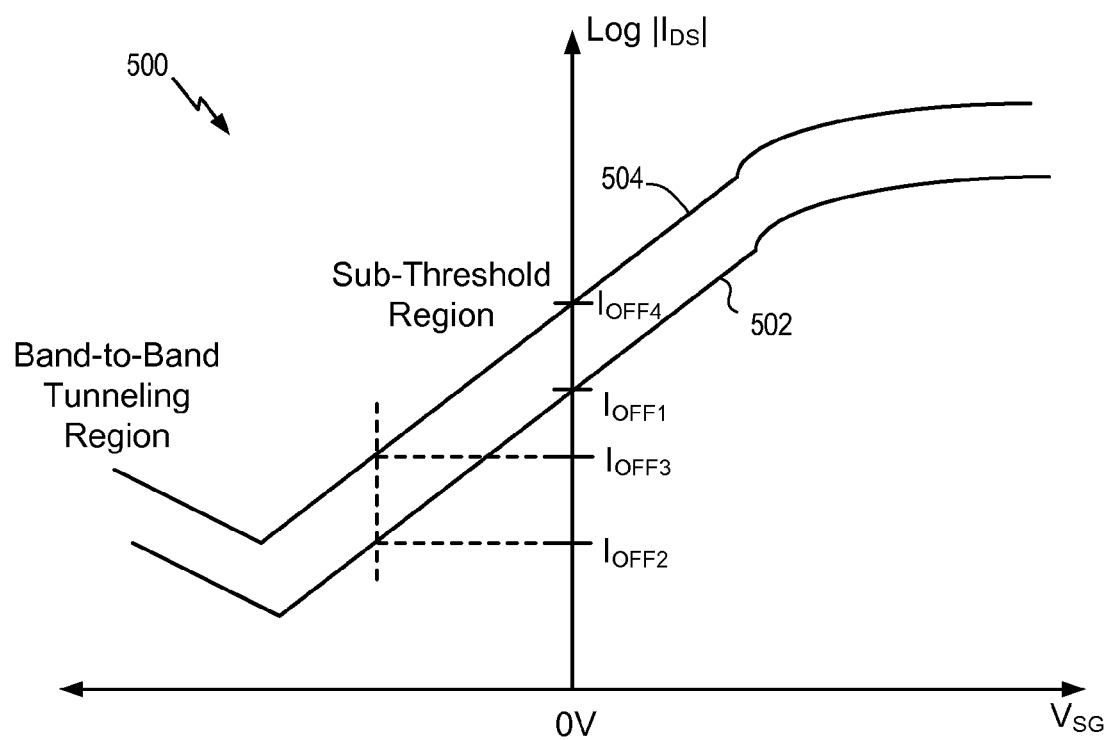
FIG. 5 is a graph relating source-to-gate voltage to drain current of two P-channel transistors according to an example implementation.

FIG. 5 is a graph 500 relating source-to-gate voltage to drain current of two P-channel transistors according to an example implementation. The graph 500 includes a y-axis representing drain current ($I_{DS}$) on a log scale, and an x-axis representing source-to-gate voltage ($V_{SG}$). A curve 502 shows the relation between $V_{SG}$ and $I_{DS}$ for a high threshold voltage P-channel transistor, and a curve 504 shows the relation between $V_{SG}$ and $I_{DS}$ for a low threshold voltage P-channel transistor. With no back-bias (i.e., $V_{SG}$=0), the leakage current of the high threshold voltage P-channel transistor is $I_{OFF1}$, and the leakage current of the low threshold voltage P-channel transistor is $I_{OFF4}$. As shown, the lower threshold voltage transistor exhibits a higher leakage current (i.e., $I_{OFF4}>I_{OFF1}$). A back-bias can be applied to the P-channel transistor, e.g., $V_{GG}$ applied to the gate and $V_{DD}$ applied to the substrate, where $V_{GG}>V_{DD}$, causing $V_{SG}$ to be negative. With the back-bias, the leakage current of the high threshold P-channel transistor is $I_{OFF2}$, and the leakage current of the low threshold voltage P-channel transistor is $I_{OFF3}$. As shown, the back-bias reduces the leakage current for each P-channel transistor. Moreover, the leakage current of the back-biased low threshold voltage P-channel transistor ($I_{OFF3}$) is less than the leakage current of the nominal leakage current of the high threshold voltage P-channel transistor ($I_{OFF1}$) without back-bias. The curves 502 and 504 show that for extreme back-bias, the P-channel transistor will transition from the sub-threshold region to the band-to-band tunneling region, and leakage current will begin to increase, rather than decrease. In a non-limiting example, $V_{GG}$ can be 200-300 my higher than $V_{DD}$ for a given low threshold P-channel transistor. $V_{GG}$ can be within other ranges of $V_{DD}$ depending on the particular characteristics of the P-channel transistor.

Figure 3:
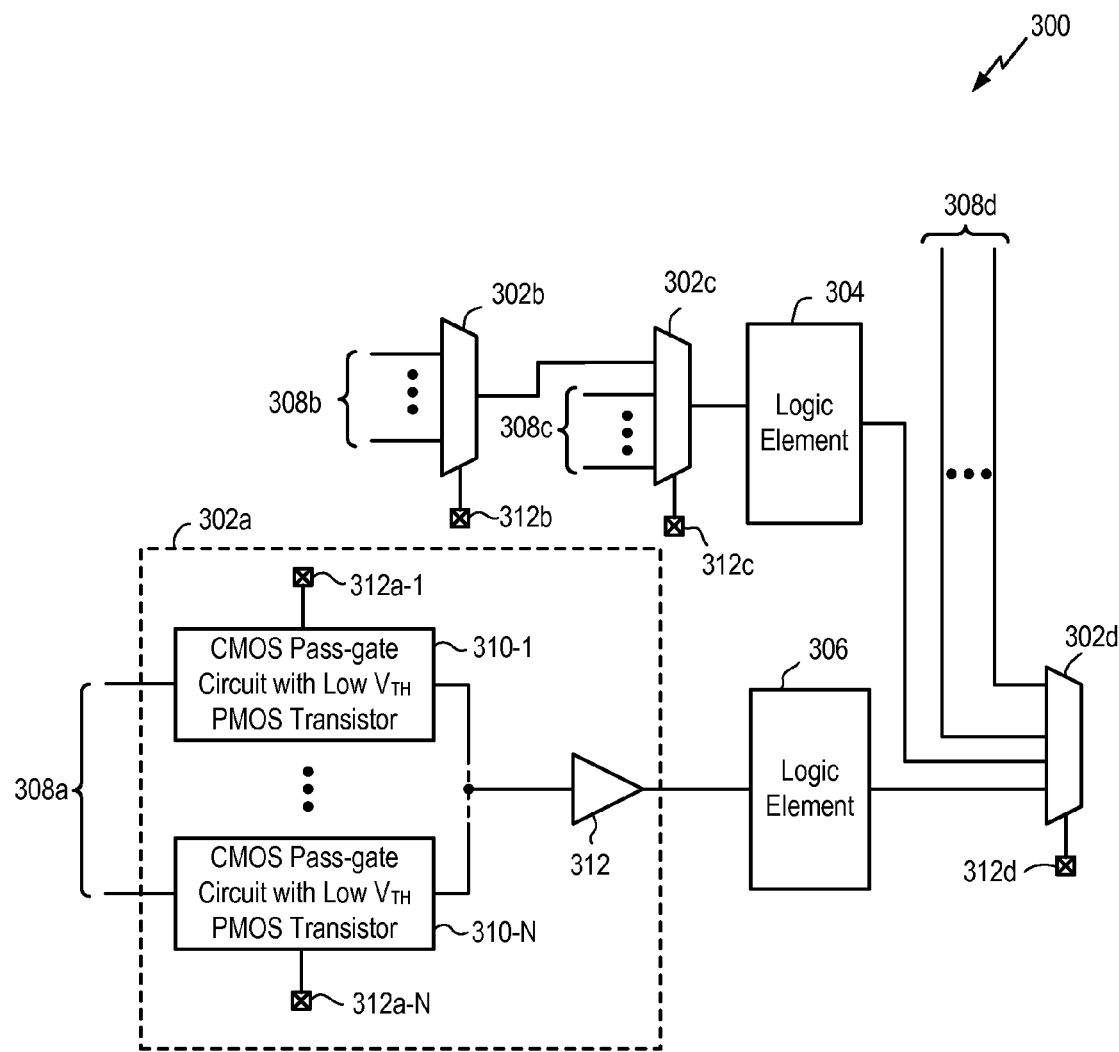
FIG. 3 is a block diagram depicting a portion of a programmable IC according to an example implementation.

FIG. 3 is a block diagram depicting a portion 300 of a programmable IC according to an example implementation. The portion 300 includes interconnect circuits 302a through 302d (collectively "interconnect circuits 302") and logic elements 304 and 306. The interconnect circuits 302 can be part of the programmable interconnect of the programmable IC, and the logic elements 304, 306 can be part of programmable logic blocks of the programmable IC, such as CLBs, IOBs, BRAMs, DSPs, and the like. The interconnect circuit 302a includes CMOS pass-gate circuits 310-1 through 310-N, where N is an integer greater than zero (collectively "CMOS pass-gate circuits 310"). The CMOS pass-gate circuits 310 selectively couple one of interconnect segments 308a to the logic element 306 through a driver 312. The CMOS pass-gate circuits 310-1 through 310-N are controlled, respectively, by memory cells 312a-1 through 312a-N (collectively "memory cells 312a"). The CMOS pass-gate circuits 310 each include a low threshold voltage PMOS transistor and can be configured as described above in FIG. 2. The interconnect circuits 302b through 302d can be configured similarly to the interconnect circuit 302a. The interconnect circuits 302b through 302d are controlled by memory cells 312b through 312d, respectively. The interconnect circuit 302b selectively couples one of interconnect segments 308b to the interconnect circuit 302c. The interconnect circuit 302 selectively couples the output of the interconnect circuit 302b or one of interconnect segments 308c to the logic element 304. The interconnect circuit 302d can selectively coupled an output of the logic element 304, an output of the logic element 306, or one of interconnect segments 308d to another node (not shown).

FIG. 3 shows a simplified example of a programmable interconnect structure of a programmable IC. In the example, the interconnect circuits 302 are described as being multiplexers. In other examples, interconnect circuits can implement other types of circuits, such as breakpoint switches, cross-point switches, and the like. Such other types of interconnect circuits can include CMOS pass-gate circuits each having a low threshold P-channel transistor as described above.

Figure 4:
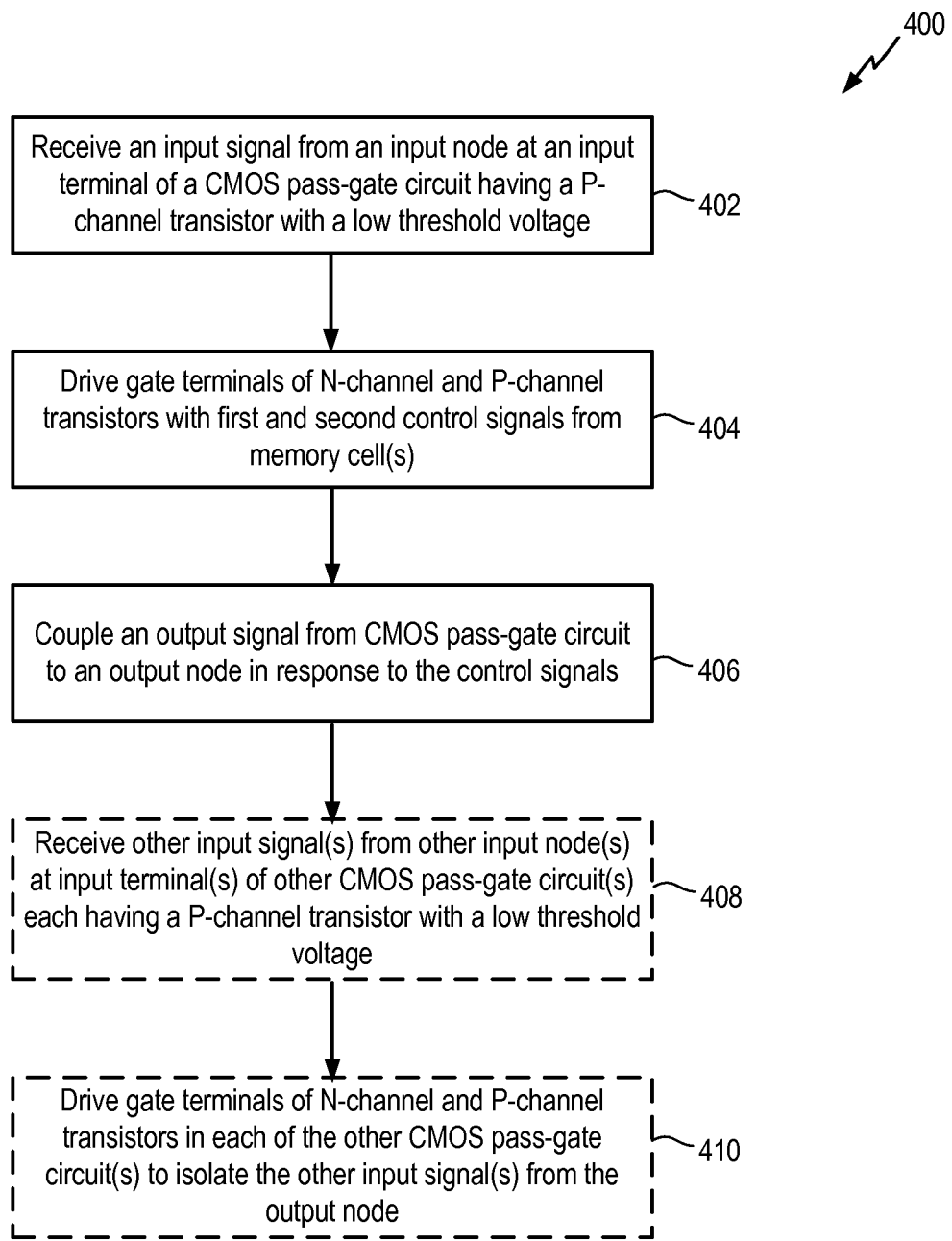
FIG. 4 is a flow diagram depicting a method of selectively coupling nodes in a programmable IC according to an example implementation.

FIG. 4 is a flow diagram depicting a method 400 of selectively coupling nodes in a programmable IC according to an example implementation. The method 400 begins at step 402, where an input signal is received from an input node at an input terminal of a CMOS pass-gate circuit having a low threshold voltage P-channel transistor. At step 404, gate terminals of N-channel and P-channel transistors in the CMOS pass-gate circuit are driven with first and second control signals from one or more memory cells. At step 406, an output signal from the CMOS pass-gate circuit is coupled to an output node in response to the control signals. Optionally, at step 408, other input signal(s) are received from other input node(s) at input terminal(s) of other CMOS pass-gate circuit(s) each having a low threshold voltage P-channel transistor. Optionally, at step 410, gate terminals of N-channel and P-channel transistors in the other CMOS pass-gate circuit(s) f are driven to isolate the other input signal(s) from the output node.

Interconnect circuits having low threshold voltage P-channel transistors for a programmable IC have been described. Interconnect delay can significantly impact performance of a programmable IC, such as an FPGA. Programmable interconnect can include a multitude of interconnect circuits, each of which can include one or more CMOS pass-gate circuits. Additional performance can be obtained from a CMOS pass-gate circuit by "overdriving" the gate of the N-channel transistor (e.g., driving the gate with a supply voltage higher than the input supply voltage). However, the P-channel transistor does not benefit from the overdrive voltage. Rather, as described in example implementations above, the P-channel transistor can be configured with a low threshold voltage for the CMOS process of the programmable IC. The low threshold voltage P-channel transistor increases performance of the CMOS pass-gate, further reducing signal delay. While the low threshold voltage P-channel transistor exhibits increased leakage current, the leakage current through the CMOS pass-gate circuits is only a small component of the overall leakage of the programmable interconnect. Moreover, the P-channel transistor operates in the accumulation region in the OFF state (e.g., gate voltage is greater than bulk voltage). In addition, the gate of the P-channel transistor can be back-biased to further limit the leakage current.

The high-performance CMOS pass-gate circuits described above can be employed in interconnect circuits having various configurations, such as multiplexers, breakpoint switches, cross-point switches, and the like. Historically, NMOS-only pass-gates have been used in programmable interconnect, since PMOS devices were much weaker in comparison and did not provide enough performance to justify the increase in implementation area. Recent CMOS processes provide PMOS devices, such as FinFET devices, that exhibit similar performance to NMOS devices in terms of drive strength. As a result, the high-performance CMOS pass-gate circuits described herein can be used to implement interconnect circuits in the programmable interconnect. The high-performance CMOS pass-gate circuits provide extra performance in a performance-critical section of the programmable interconnect without any considerable increase in interconnect power and with no impact on interconnect implementation area. Further, the high-performance CMOS pass-gates provide the increased performance without resorting to significant modification of transistor geometry, such as gate length reduction, transistor channel width increase, and the like.

Example implementations described above include high-performance CMOS pass-gate circuits in interconnect circuits of programmable interconnect in a programmable IC. The high-performance CMOS pass-gate circuits can also be used in other types of interconnect circuits that generally couple input nodes and output nodes in an IC.

While the foregoing is directed to specific examples, other and further examples may be devised without departing from the basic scope thereof, and the scope thereof is determined by the claims that follow.

What is claimed is:

1. An interconnect circuit for a programmable integrated circuit (IC), comprising:
    an input terminal coupled to receive from a node in the programmable IC;
    an output terminal coupled to transmit towards another node in the programmable IC;
    first and second control terminals coupled to receive from a memory cell of the programmable IC; and
    a complementary metal oxide semiconductor (CMOS) pass-gate coupled between the input terminal and the output terminal and to the first and second control terminals, the CMOS pass-gate including a P-channel transistor configured with a low threshold voltage for a CMOS process used to fabricate the programmable IC, the P-channel transistor including a first terminal coupled to the input terminal, a second terminal coupled to the output terminal, a gate terminal coupled to the second control terminal, and a body terminal;
wherein the gate terminal of the P-channel transistor is coupled to a control signal having a first supply voltage higher than a second supply voltage of an input signal coupled to the input terminal, and the body terminal of the P-channel transistor is coupled to the second supply voltage.

2. The interconnect circuit of claim 1, further comprising: a driver coupled between the CMOS pass-gate and the output terminal.

3. The interconnect circuit of claim 1, further comprising: another CMOS pass-gate circuit coupled between a second input terminal and the output terminal and to third and fourth control terminals coupled to receive from another memory cell of the programmable IC, the another CMOS pass-gate circuit including a P-channel transistor configured with the low threshold voltage.

4. The interconnect circuit of claim 3, wherein:
the gate terminal of the P-channel transistor in the other CMOS pass-gate circuit is coupled to a reference voltage.

5. The interconnect circuit of claim 1, wherein:
the CMOS pass-gate comprises an N-channel transistor coupled in parallel with the P-channel transistor; and
the N-channel transistor includes a first terminal coupled to the input terminal, a second terminal coupled to the output terminal, and a gate terminal coupled to the first control terminal.

6. The interconnect circuit of claim 5, wherein:
the N-channel transistor includes a body terminal coupled to a reference voltage.

7. The interconnect circuit of claim 5, wherein the gate terminal of the N-channel transistor is coupled to a control signal having the first supply voltage.

8. A programmable integrated circuit (IC), comprising:
interconnect segments;
configuration memory cells; and
logic elements coupled to the interconnect segments through interconnect circuits programmable by a portion of the configuration memory cells;
wherein a first interconnect circuit includes a first complementary metal oxide semiconductor (CMOS) pass-gate circuit having an N-channel transistor coupled in parallel with a P-channel transistor;
wherein the P-channel transistor is configured with a low threshold voltage for a CMOS process used to fabricate the programmable IC; and
wherein a gate terminal of the P-channel transistor is coupled to a control signal having a first supply voltage higher than a second supply voltage of an input signal to the pass gate circuit, and a body terminal of the P-channel transistor is coupled to the second supply voltage.

9. The programmable IC of claim 8, the first interconnect circuit includes a driver coupled to an output of the first CMOS pass-gate circuit.

10. The programmable IC of claim 9, wherein:
the first interconnect circuit includes a second CMOS pass-gate circuit:
the driver is coupled to an output of the second CMOS pass-gate circuit; and
the second CMOS pass-gate circuit includes an N-channel transistor coupled in parallel with a P-channel transistor, the P-channel transistor thereof configured with the low threshold voltage.

11. The programmable IC of claim 10, further comprising:
a second configuration memory cell having a first output coupled to a gate terminal of the N-channel transistor of the second CMOS pass-gate circuit and a second output coupled to a gate terminal of the P-channel transistor of the second CMOS pass-gate circuit;
wherein the second configuration memory cell is coupled to drive the gate terminal of the P-channel transistor of the second CMOS pass-gate circuit with a reference voltage.

12. The programmable IC of claim 8, wherein each of the at least one additional interconnect circuit includes at least one CMOS pass-gate circuit each having an N-channel transistor coupled in parallel with a P-channel transistor, the P-channel transistor thereof configured with the low threshold voltage.

13. The programmable IC of claim 8, wherein the programmable IC comprises a field programmable gate array (FPGA).

14. The programmable IC of claim 8, further comprising:
a first configuration memory cell having a first output coupled to a gate terminal of the N-channel transistor and a second output coupled to the gate terminal of the P-channel transistor.

15. The programmable IC of claim 14, wherein the first configuration memory cell is coupled to drive the gate terminal of the N-channel transistor with a control signal having the second supply voltage.

16. A method of selectively coupling nodes in a programmable IC, comprising:
receiving an input signal from an input node at an input terminal of a complementary metal oxide semiconductor (CMOS) pass-gate circuit having an N-channel transistor coupled in parallel with a P-channel transistor, the P-channel transistor configured with a low threshold voltage for a CMOS process used to fabricate the programmable IC;
driving a gate terminal of the P-channel transistor with a first control signal from a memory cell in the programmable IC, the first control signal comprising a first supply voltage higher than a second supply voltage of the input signal;
driving a body terminal of the P-channel transistor with the second supply voltage;
driving a gate terminal of the N-channel transistor with a second control signal from the memory cell; and
coupling an output signal from the CMOS pass-gate circuit to an output node in response to the first control signal and the second control signal.

17. The method of claim 16, further comprising:
receiving another input signal from another input node at an input terminal of another CMOS pass-gate circuit having an N-channel transistor coupled in parallel with a P-channel transistor, the P-channel transistor thereof configured with the low threshold voltage;
driving a gate terminal of the N-channel transistor of the other CMOS pass-gate with a third control signal from another memory cell in the programmable IC; and
driving a gate terminal of the P-channel transistor of the other CMOS pass-gate with a fourth control signal from the other memory cell.

18. The method of claim 17, wherein:
the second control signal comprises a reference voltage;
the third control signal comprises the first supply voltage; and
the fourth control signal comprises the reference voltage.

19. The method of claim 16, wherein
the programmable IC comprises a field programmable gate array (FPGA); and
each of the input node and the output node comprises a logic element or an interconnect segment of the FPGA.

\* \* \* \* \*